United States Patent [19]

Laudise

[11] Patent Number: 4,654,111

[45] Date of Patent: Mar. 31, 1987

[54] HYDROTHERMAL GROWTH OF POTASSIUM TITANYL PHOSPHATE

[75] Inventor: Robert A. Laudise, Berkeley Heights, N.J.

[73] Assignee: AT&T Laboratories, Murray Hill, N.J.

[21] Appl. No.: 803,303

[22] Filed: Dec. 2, 1985

[51] Int. Cl.[4] .................. C01B 25/45; C30B 7/10; C30B 29/14

[52] U.S. Cl. .................. 156/623 R; 156/DIG. 75; 423/306

[58] Field of Search .................. 423/306; 156/633 R, 156/DIG. 75

[56] References Cited

U.S. PATENT DOCUMENTS

| | | | |
|---|---|---|---|
| 3,201,209 | 8/1965 | Caporaso et al. | 156/623 R |
| 3,949,323 | 4/1976 | Bierlein et al. | 156/623 R |
| 4,231,838 | 11/1980 | Gier | 156/DIG. 75 |
| 4,305,778 | 12/1981 | Gier | 156/DIG. 75 |
| 4,579,622 | 4/1986 | Caporaso et al. | 156/623 R |

OTHER PUBLICATIONS

*Nonlinear Optical Materials for Second Harmonic Generation (KTP); Phase I: Preparation of 5MM Cubes,* R. F. Belt et al, Avionics Laboratory, Wright-Patterson Air Force Base, Ohio; May 1984 (94 pages).

Primary Examiner—Gary P. Straub
Attorney, Agent, or Firm—Bruce S. Schneider

[57] ABSTRACT

Crystals of potassium titanyl phosphate suitable for device applications are grown by a hydrothermal process. By maintaining the growth temperature substantially below conventional levels, the crystal growth rate is maintained, and noble metal-lined vessels are employable.

15 Claims, 2 Drawing Figures

HYDROTHERMAL GROWTH OF POTASSIUM TITANYL PHOSPHATE

BACKGROUND OF THE INVENTION

1. Field of the Invention

This invention relates to crystal growth and, in particular, hydrothermal crystal growth.

2. Art Background

The hydrothermal process is utilized for growing a wide variety of crystals. In this process typically a pressure vessel, e.g., a cylindrical pressure vessel, having a baffle or other means to produce a temperature gradient is partially filled at room temperature with an aqueous solution—a growth medium. Crystal nutrient material is introduced on one side of the baffle (or gradient), and seed crystals are introduced on the other. The pressure vessel is sealed and heating is initiated. The temperature gradient is adjusted to induce dissolution of the nutrient and growth on the seed. When the solubility of the nutrient increases with increasing temperature, such as in the growth of potassium titanyl phosphate, a suitable gradient is typically induced by heating the nutrient region directly and allowing the seed region to heat through conduction and/or convection. As the growth temperature is reached, the growth medium expands, fills the vessel, produces a significantly elevated internal pressure, and growth is initiated.

Generally, pressure must be limited by, in turn, limiting the degree of fill due to strictures imposed by processing conditions and vessel design. In particular, for the growth of crystals such as potassium titanyl phosphate, the vessel must be designed to have internal surfaces containing noble metals, e.g., gold or platinum, to prevent corrosion by the growth medium. Two configurations employing noble metal containers are utilized. In a first configuration, the vessel itself is lined with a noble metal material, and the seals of the vessel are formed by suitable mechanical interaction of the noble metal liner. Typically, this design is employed at pressures below 15,000 psi for 1 inch diameter vessels because at higher pressures, the noble metal seals are generally not adequate. For pressures above 15,000 psi, a second configuration is employed. In this configuration, a separate noble metal container 12, such as shown in FIG. 1, is present in the steel alloy pressure vessel 14. (In this configuration, 15 is the baffle, 16 is the seed, and 18 is the nutrient.) This container is filled with the growth medium and is surrounded by water to counterbalance the pressure generated during growth. In either vessel configuration, if nutrient region temperatures above 450 degress C. are required, the vessel itself must be an expensive, high temperature steel alloy rather than an easily machined, inexpensive, low carbon steel.

It is thus desirable to mitigate the growth temperature required for satisfactory growth of crystals such as potassium titanyl phosphate. In this manner, the possibility of employing a low carbon steel vessel is afforded. Lowering temperature, in turn, lowers the pressure at a given fill and also offers the possibility of employing the more desirable noble metal liner design. Indeed, compositions denominated mineralizers, e.g., potassium and phosphate containing glasses, are added to the growth medium to lower the required growth temperature. These mineralizers do have the effect of decreasing the pressure encountered at a given temperature while generally increasing the solubility of the nutrient in the growth medium.

However, to attain satisfactory crystal quality in an acceptable growth period, i.e., to attain growth rates of at least 0.04 to 0.1 mm/day/side, not only is an appropriate mineralizer necessary, but also the processing conditions must be suitably adjusted. Since the usable pressures and thus, in turn, the usable percentage fills are substantially limited by practical considerations, the growth temperature is the primary processing parameter adjusted to control the growth rate. Thus, for crystals such as potassium titanyl phosphate, where nutrient solubility increases with increasing temperature, it has been an overriding objective within pressure constraints to maintain relatively high growth temperatures, i.e., greater than 590 degrees C. in the nutrient region (despite the associated substantial inconveniences), to enhance, in turn, solubility and thus enhance growth rate. For example, as reported in "Nonlinear Optical Materials for Second Harmonic Generation (KTP)," by R. F. Belt et al, Avionics Laboratory, Air Force Wright Aeronautical Laboratories, Air Force Systems Command, Wright-Patterson Air Force Base, Ohio, and in U.S. Pat. No. 3,949,323, issued Apr. 6, 1976, growth temperatures of at least 590 degrees C. in the nutrient region are required for the growth of potassium titanyl phosphate at an adequate rate.

As discussed, growth temperatures of 590 degrees C. require the use of a vessel having a separate noble metal container with a surrounding liquid to counteract pressure and requires a high temperature alloy steel. Unfortunately, this configuration has several undesirable features. For example, the presence of an additional container necessitates a smaller charge for a given vessel size and thus a smaller yield. It is difficult to maintain an equalized pressure around the container throughout the growth procedure. Thus, the container is often damaged, and concomitant costly repair is required. Additionally, the temperature gradient between nutrient region and seed region is less well controlled than in the liner configuration, and therefore it is more difficult to maintain crystal quality. The significant expense of high temperature alloy steel also substantially diminishes the desirability of the growth apparatus required for potassium titanyl phosphate.

SUMMARY OF THE INVENTION

Surprisingly, despite the conventional observation that solubility decreases with decreasing temperature, the use of nutrient region temperatures in the range 400 to 450 degrees C. for hydrothermal growth of potassium titanyl phosphate does not decrease, and possibly increases, the growth rate compared to those attained at temperatures above 590 degrees C. This temperature reduction allows the use of noble metal liners rather than separate containers, avoids the difficulties associated with such a container, and allows the use of a low carbon steel vessel. For example, for nominal fill percentages with the use of a potassium phosphate mineralizer (potassium/phosphorus ratio of approximately 2:1), nutrient region temperatures in the range 400 to 450 degrees C. yield growth rates up to 0.34 mm/day/side. Thus, contrary to conventional precepts, desirable growth rates are obtained at lower temperatures in a material, i.e., potassium titanyl phosphate, whose solubility increases with increasing temperature, and these lower temperatures substantially simplify the growth procedure.

DETAILED DESCRIPTION

Figure 1:
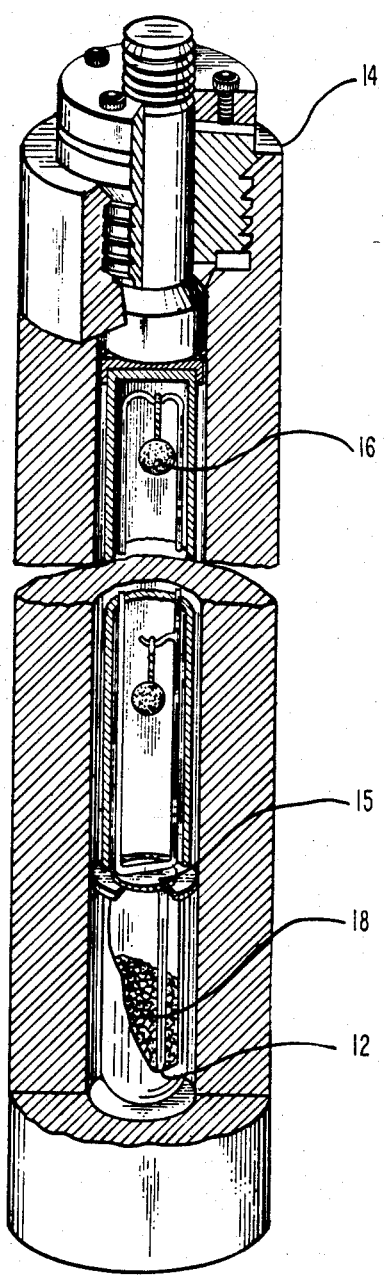
FIG. 1 shows a growth apparatus for high temperature growth.

The invention involves the use of a hydrothermal process to grow potassium titanyl phosphate crystals. Growth rates greater than 0.1 mm/day/side are achieved even at substantially lower temperatures than are conventionally considered reasonable. As discussed, in the hydrothermal process to induce growth, a temperature gradient is established between the nutrient region and the seed region. Generally, the nutrient region should be maintained at a temperature between 375 and 450 degrees C., preferably between 400 and 425 degrees C. The temperature in the growth region should typically be maintained between 350 and 425 degrees C., preferably between 375 and 400 degrees C. For nutrient and growth region temperatures respectively less and 375 and 350 degrees C., the solubility of the nutrient is too low, the growth rate is excessively slow, and the crystal growth is generally not acceptable. Typically, for nutrient and growth region temperatures respectively above 450 and 425 degrees C., the pressure is too high for use of a noble metal liner. Additionally, a temperature gradient between the growth region (cooler region) and the nutrient region (hotter region) in the range 25 to 100 degrees C., preferably in the range 25 to 50 degrees C., is desirable. For temperature gradients less than 25 degrees C., the growth rate is substantially decreased, while for temperature gradients above 100 degrees C., the crystal quality is substantially degraded, and spurious nucleation on the walls of the vessel is significant.

To obtain advantageous growth rates, it is desirable to use mineralizers containing both potassium and phosphate. For example, materials such as described by Belt et al supra formed from the combination of $KH_2PO_4$ and $K_2PO_4$ are suitable. However, it has been found that the combined mineralizer need not be in the form of a glass. Mineralizers are advantageously employed that are an admixture of phosphate and potassium containing compounds or that include a single compound. Additionally, these mineralizers should have a potassium-to-phosphorus ratio in the range 1.25 to 3.0. Ratios above 3.0 yield crystallization products other than potassium titanyl phosphate, while ratios below 1.5 lead to excessively slow growth. The concentration of the mineralizer is advantageously in the range 0.5 to 6.0 molar in potassium. Concentrations lower than 0.5 molar or above 6.0 molar lead to poor quality crystal growth. An advantageous mineralizer is formed from $K_2HPO_4$ alone in the concentration range 1.0 to 3.0 molar.

The growth medium is formed from the mineralizer in combination with a potassium titanyl phosphate nutrient or from the mineralizer with a nutrient of potassium titanyl phosphate and $TiO_2$. The amount of nutrient is not critical provided enough is present to saturate the growth medium and provide sufficient material for the expected mass increase on the seed(s). Nutrient surface area is advantageously 5 to 10 times the seed surface area so that the rate of nutrient dissolution does not undesirably limit crystal growth. Typically, the ratio of potassium to titanium in the growth medium at room temperature before growth initiation should be in the range 1.0 to 2.0. Ratios above 2.0 lead to the formation of insoluble non-titanium-containing compounds, while ratios below 1.0 result in anatase ($TiO_2$) growth. Additionally, the presence of an oxidizing agent in the growth medium enhances crystal quality. A contemplated explanation for this phenomenon is that this agent prevents the reduction of titanium and other easily reducible species. An exemplary oxidizing agent is $KNO_3$ in typical concentrations of approximately 0.25 molar.

Figure 2:
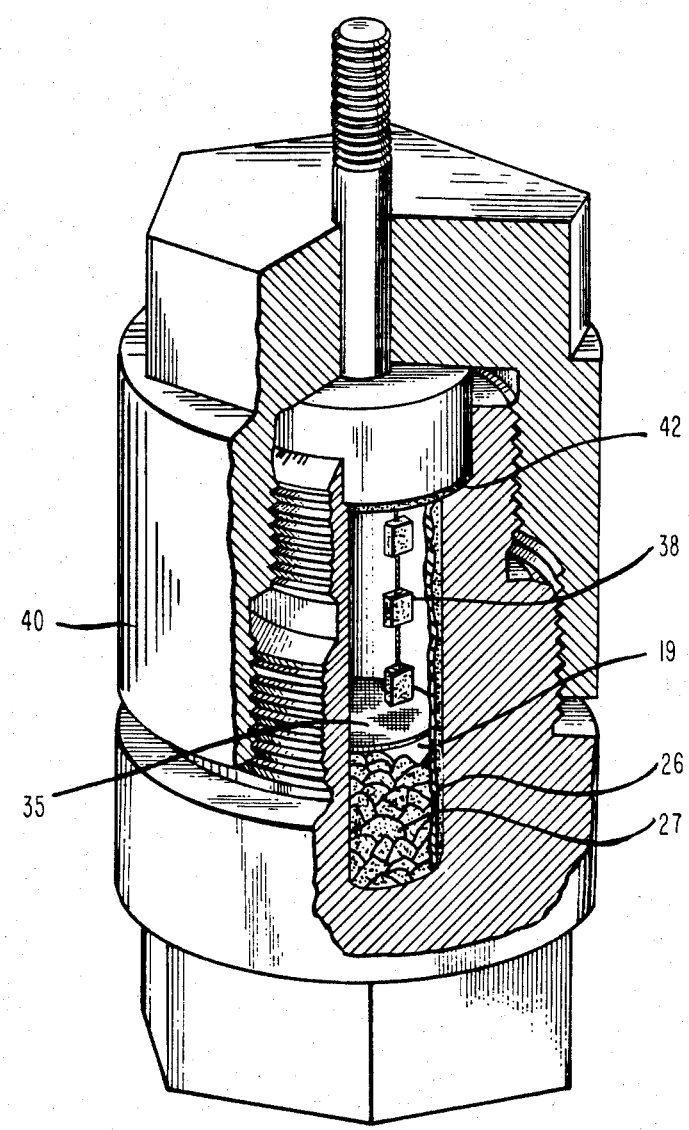
FIG. 2 shows an apparatus suitable for the inventive process.

A growth vessel useful for the growth of potassium titanyl phosphate is shown in FIG. 2. This vessel contains the growth medium, 19, a noble metal liner, 26, and a nutrient material, 27. (Nutrient material is obtainable from previous growth procedures or from flux grown material, as described by R. Masse and J. C. Grenier in *Bulletin de la Societe Francaise de Mineralogie et de Cristallographie*, Vol. 94, page 437 (1971).) Seeds are provided in the reaction vessel as previously discussed. Heating is controlled so that a thermal gradient is established (for example, with a baffle 35) between the nutrient region (hotter region) and the seed region (colder region), i.e., the region where seed nucleation is initiated on the vessel walls or on a seed crystal, 38. As a result, a driving force for crystal growth in the seed region is produced.

The percentage fill, i.e., the room temperature atmospheric pressure volume of the solution divided by the free volume of the vessel (vessel volume less the volume of nutrient, seeds, frame, and baffle), should be maintained so that excessive pressure is not encountered at the growth temperature. Typically, for the previously discussed temperatures in the nutrient region and in the seed region, percentage fills should be employed in the range 65 to 85 percent, preferably 70 to 80 percent. For percentage fills less than 65 percent, typically two phases are present in the growth vessel, i.e., a liquid and a gas phase. The presence of these two phases results in poor crystal quality. Additionally, for percentage fills above 85 percent, generally the pressure is excessively high and leads to difficulties in pressure vessel integrity. Typically, fills in the lower range of acceptability, i.e., fills in the range of 65 percent, are not advantageously utilized in conjunction with temperatures in the higher portion of the acceptable range, i.e., nutrient region temperatures near 450 degrees C. and growth region temperatures in the vicinity of 425 degrees C. Such a combination decreases solubility, slows crystal growth, and degrades crystal quality.

After the growth medium, seed crystals, and nutrient are introduced into the pressure vessel, the temperature is generally rapidly increased to the growth temperature, and an appropriate gradient is established. This condition is generally maintained for a period of 10 to 40 days to produce crystals having a maximum dimension of at least 1 cm. The time of growth is not critical and is adjusted to yield the desired extent of growth.

The following examples are illustrative of the invention:

EXAMPLE 1

The apparatus shown in FIG. 2 was utilized to grow single crystals of potassium titanyl phosphate. This apparatus included a low carbon steel vessel, 40, a platinum liner, 26, utilizing seals, 42, and a baffle, 35. The baffle was a disk 1/16 inch in thickness having perforations that occupied approximately 5 percent of its surface area. Seed crystals, 38, having an orientation in the (001) plane were inserted in holders. The growth medium, 19, was introduced into the vessel to produce a 75 percent fill. The growth medium included (1) a mineralizer that was 2 molar aqueous $K_2HPO_4$ and (2) approximately 7 grams of potassium titanyl phosphate random crystals as the nutrient. The nutrient had a surface area of approximately 20 times that of the seed crystals.

The vessel was rapidly heated to establish a temperature of 325 degrees C. in the seed region and 425 degrees C. in the nutrient region. (Both regions, because of the use of the baffle, were essentially isothermal.) This temperature gradient was maintained for a period of approximately 11 days. After 11 days, the temperature was reduced and the grown crystals removed. Growth averaged approximately 26.8 mils/day on both sides of the seed, i.e, 0.34 mm/day/side. The crystal contained some slight flawing.

EXAMPLE 2

The procedure of Example 1 was followed except the seed surface was in the (010) plane. The observed growth rate was 16.9 mils/day (0.21 mm/day/side), and the crystal quality was approximately the same as that of Example 1.

EXAMPLE 3

The procedure of Example 1 was followed except the seed surface was in the (011) plane. The observed rate of growth was 8.8 mils/day (0.11 mm/day/side), and the observed crystal quality was approximately the same as that of Example 1.

EXAMPLE 4

The procedure of Example 1 was followed except the mineralizer contained an aqueous solution which was 2 molar in $K_2HPO_4$ and 0.4 molar in $KPO_3$. Additionally, the seed surface was in the (010) plane. The growth weight was approximately 4.4 mils/day (0.05 mm/day/side), and the resulting crystals exhibited only slight flawing.

EXAMPLE 5

The procedure of Example 1 was followed except an 80 percent fill was employed. Additionally, the nutrient region was maintained at 400 degrees C. and the seed region at 350 degrees C. The seed crystal had its surfaces in the (011) plane. Growth was continued for approximately 12 days. A growth rate of 3.4 mils/day (0.043 mm/day/side) was obtained, and the crystals were of excellent quality.

EXAMPLE 6

The procedure of Example 3 was followed except sufficient $KNO_3$ was added to the growth medium to make the solution 0.25 molar in $KNO_3$. The observed growth rate was 15.6 mils/day (0.195 mm/day/side). Both growth rate and crystal quality were improved by the use of the $KNO_3$.

What is claimed is:

1. A hydrothermal process for growing a crystal of potassium titanyl phosphate comprising the steps of (1) providing in a pressure vessel (a) means for nucleating said crystal in a growth region, (b) a growth medium comprising nutrient and a mineralizer in a nutrient region, and (c) means for producing a temperature gradient between said growth region and said nutrient region and (2) producing a growth temperature in said growth region and a nutrient temperature in said nutrient region wherein said growth temperature is lower than said nutrient temperature whereby growth of said crystal is initiated characterized in that
said growth temperature is in the range 350 to 425 degrees C.

2. The process of claim 1 wherein said growth temperature is in the range 375 to 400 degrees C.

3. The process of claim 2 wherein said nutrient temperature is in the range 375 to 450 degrees C.

4. The process of claim 2 wherein said nutrient temperature is in the range 400 to 425 degrees C.

5. The process of claim 1 wherein said nutrient temperature is in the range 375 to 450 degrees C.

6. The process of claim 1 wherein said nutrient temperature is in the range 400 to 425 degrees C.

7. The process of claim 1 wherein said vessel comprises low carbon steel.

8. The process of claim 1 wherein said nucleating means comprises a seed crystal.

9. The process of claim 1 wherein said mineralizer comprises a composition having a potassium-to-phosphorus ratio in the range 1.25 to 3.0.

10. The process of claim 9 wherein said mineralizer is formed from $K_2HPO_4$.

11. The process of claim 9 wherein said growth temperature is in the range 375 to 400 degrees C.

12. The process of claim 9 wherein said mineralizer comprises $K_2HPO_4$.

13. The process of claim 12 wherein said growth temperature is the range 375 to 400 degrees C.

14. The process of claim 1 wherein said nutrient includes $TiO_2$.

15. The process of claim 1 wherein said growth temperature is at least 25 degrees C. lower than said nutrient temperature.

* * * * *

UNITED STATES PATENT AND TRADEMARK OFFICE
CERTIFICATE OF CORRECTION

PATENT NO. : 4,654,111

DATED : March 31, 1987

INVENTOR(S) : Robert A. Laudise

It is certified that error appears in the above-identified patent and that said Letters Patent is hereby corrected as shown below:

On the Cover Page, "AT&T Laboratories" should read --AT&T Bell Laboratories--.

Column 3, line 23, "and" should read --than--. (1st occurrence)

Signed and Sealed this

Fifteenth Day of December, 1987

Attest:

DONALD J. QUIGG

*Attesting Officer*              *Commissioner of Patents and Trademarks*